United States Patent [19]

Holden

[11] Patent Number: 4,504,194
[45] Date of Patent: Mar. 12, 1985

[54] AIR LOCK VACUUM PUMPING METHODS AND APPARATUS

[75] Inventor: Scott C. Holden, Manchester, Mass.

[73] Assignee: Varian Associates, Inc., Palo Alto, Calif.

[21] Appl. No.: 381,289

[22] Filed: May 24, 1982

[51] Int. Cl.³ .............................................. F04B 37/14
[52] U.S. Cl. ........................................ 417/48; 417/53; 137/571; 250/441.1
[58] Field of Search .................. 60/407; 137/568, 571; 417/49, 53, 48; 250/441.1, 492.2

[56] References Cited

U.S. PATENT DOCUMENTS

| 719,772 | 2/1903 | Fanta | 417/48 |
|---|---|---|---|
| 2,142,514 | 1/1939 | Jones | 60/407 |
| 3,901,183 | 8/1975 | Wittkower | 118/49.1 |
| 3,954,191 | 5/1976 | Wittkower et al. | 214/17 B |
| 3,983,402 | 9/1976 | Arndt, Jr. et al. | 250/441.1 |
| 4,283,631 | 8/1981 | Turner | 250/492 B |

FOREIGN PATENT DOCUMENTS

| 16012 | 2/1977 | Japan | 417/48 |
|---|---|---|---|
| 113511 | 9/1979 | Japan | 417/442 |

*Primary Examiner*—Leonard E. Smith
*Attorney, Agent, or Firm*—Stanley Z. Cole; William R. McClellan

[57] ABSTRACT

Method and apparatus for high speed vacuum pumping of an air lock. A vacuum pumped expansion tank having a volume larger than the volume of the air lock is coupled through a valve to the air lock. When evacuation of the air lock is desired, the valve is opened for a brief duration and the gas in the air lock rapidly expands into the expansion tank. Multiple pumping stages, each including a vacuum pumped expansion tank coupled through a valve to the air lock, can be utilized to decrease the final pressure in the air lock. The valves are sequentially opened to permit sequential expansion of the gas in the air lock into the expansion tanks. Multiple air locks can time share the same pumping system.

4 Claims, 5 Drawing Figures

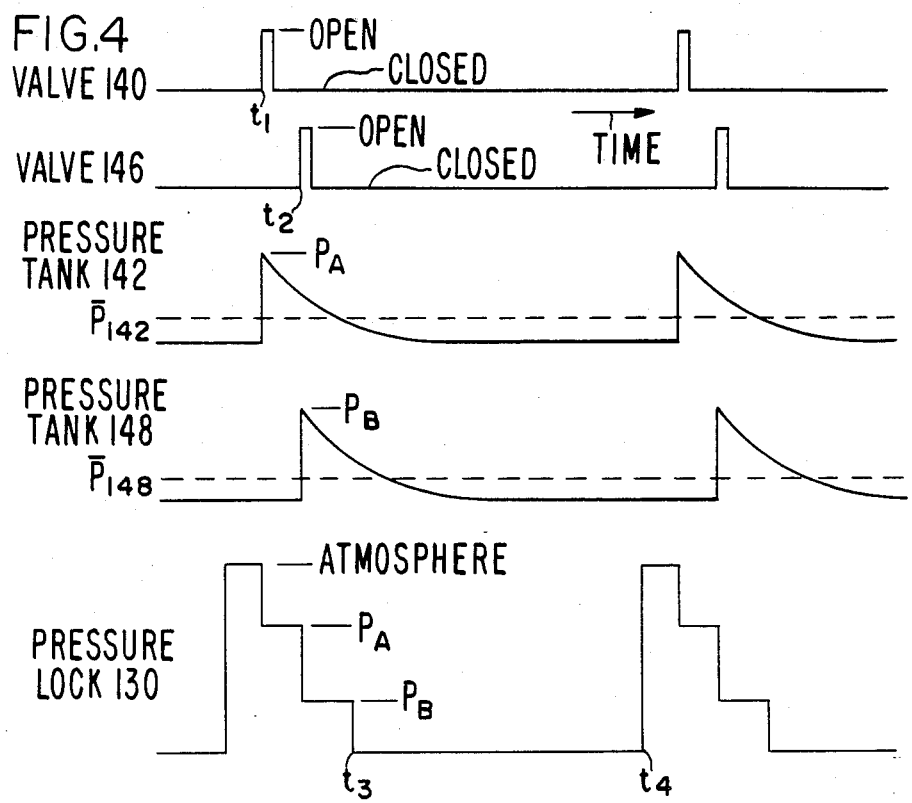
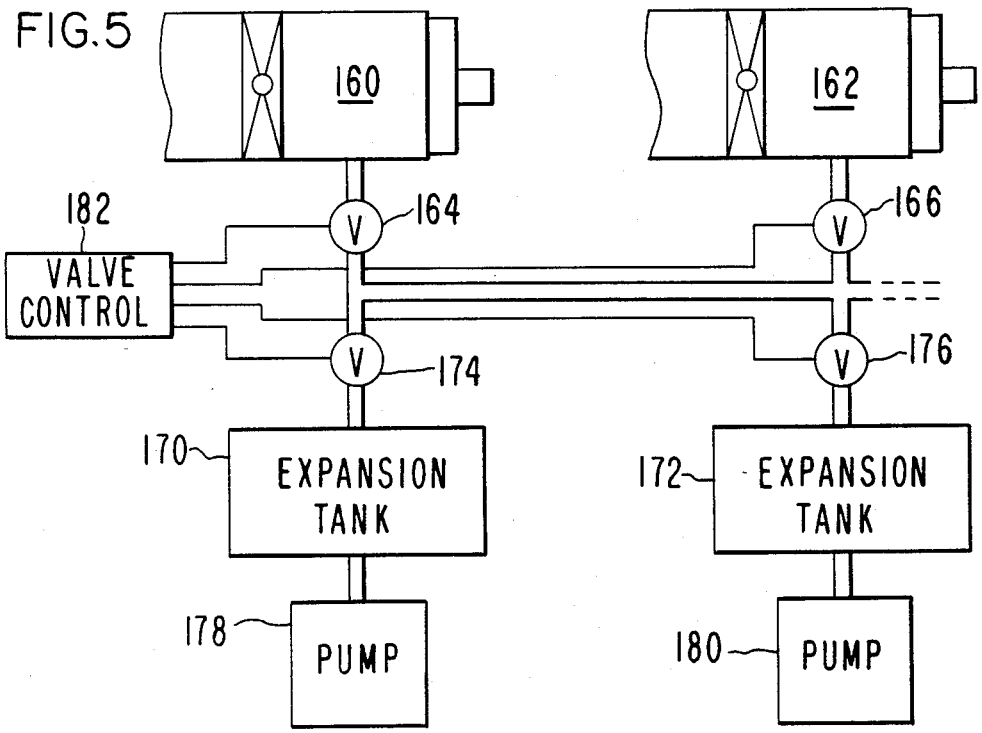

AIR LOCK VACUUM PUMPING METHODS AND APPARATUS

DESCRIPTION

Background of the Invention

This invention relates to vacuum processing of articles and, more particularly, to methods and apparatus for high speed vacuum pumping of an air lock used to transfer semiconductor wafers to and from a high vacuum wafer processing chamber.

Ion implantation has become a standard technique for introducing impurities into semiconductor wafers in a controlled and rapid manner. A beam of ions is generated in a source and directed with varying degrees of acceleration toward the semiconductor wafer. The impurities are introduced into the bulk of semiconductor wafers by using the momentum of the ions as a means of imbedding them in the crystalline lattice of the semiconductor material. Uniformity of impurity concentration over the surface of the semiconductor wafer is of utmost importance in semiconductor processing. In addition, one of the major objectives in commercial semiconductor processing is to achieve a high throughput in terms of wafers processed per unit time.

One way to achieve high throughput is to simultaneously process a number of wafers in a batch. Such systems typically involve mechanical movement of wafers in relation to a beam which is scanned in one direction. Batch processing systems, however, are generally large to accommodate the batches and are generally used only for high dose implantations. In addition, throughput is less than optimum because of the time required to manually change batches. Furthermore, if the processing system malfunctions, large numbers of expensive semiconductor wafers can be destroyed.

Another approach has been to process wafers one at a time and to employ automatic wafer handling systems to improve throughput. The wafer is typically held stationary, and the ion beam is electrostatically scanned in a two-dimensional pattern over its surface. Such a system is disclosed in U.S. Pat. No. 4,283,631 issued Aug. 11, 1981, to Turner. One of the difficulties in achieving high throughput in these so-called serial processing systems is that the times required for moving the wafer into the processing chamber and for vacuum pumping the chamber add directly to the total processing time and are repeated for each wafer. Therefore, these times as well as the actual ion implantation time must, to the extent possible, be minimized.

Typically, the vacuum pumping time is minimized by the use of an air lock which has a small volume and which is connected to the main processing chamber by a vacuum gate valve. The semiconductor wafer to be processed is introduced into the air lock through a chamber door which is then closed and sealed. The air lock, now isolated from both the main processing chamber and from atmosphere, is vacuum pumped to the desired level of vacuum and the vacuum gate valve connecting the air lock to the main processing chamber is opened.

Prior art systems have employed a mechanical roughing pump connected to the air lock. Air is removed by the pump at a rate limited by the speed of the pump. When the pump is initially connected to the atmospheric pressure of the air lock, it experiences a large increase in load. During the remainder of the cycle, the pump is disconnected from the air lock and performs little or no useful work. These large swings in pump loading can seriously degrade the service life of the pump. Furthermore, in order to achieve high speed pumping of the air lock, a relatively expensive high speed pump must be employed. Less expensive pumps have lower pumping speeds and increase the air lock pumping time. Neither alternative is acceptable in achieving a cost effective high throughput system.

It is a general object of the present invention to provide novel methods and apparatus for high speed vacuum pumping of an air lock.

It is another object of the present invention to provide high speed vacuum pumping of an enclosure which is evacuated on an intermittent basis.

It is yet another object of the present invention to provide an air lock vacuum pumping system wherein the excursions in pumping pressure experienced by the vacuum pump are relatively small and wherein small, low cost vacuum pumps can be efficiently utilized.

SUMMARY OF THE INVENTION

According to the present invention, these and other objects and advantages are achieved in apparatus for high speed intermittent vacuum pumping of an enclosure. The apparatus comprises a vacuum valve having one port adapted for coupling to the enclosure and an expansion tank coupled to the other port of the vacuum valve. The tank has a volume larger than the volume of the enclosure. The apparatus further comprises control means operative, when evacuation of the enclosure is desired, to open the vacuum valve for a predetermined time sufficient for substantial equalization of pressure in the enclosure and the expansion tank and a vacuum pump coupled to the expansion tank and operative to pump gas from the expansion tank. When the vacuum valve is opened, the pressure in the enclosure is reduced by expansion of the gas in the enclosure into the expansion tank. The vacuum pump maintains a low average pressure in the expansion tank.

According to another feature of the present invention, a plurality of vacuum pumping stages, each comprising a vacuum valve having one port adapted for coupling to an enclosure, an expansion tank coupled to the other port of the vacuum valve, and a vacuum pump coupled to the expansion tank, is utilized to provide high speed intermittent vacuum pumping of the enclosure. The vacuum valves are opened sequentially, and the pressure in the enclosure is successively reduced by the sequential expansion of the gas in the enclosure into each of the expansion tanks.

According to another aspect of the present invention, there is provided a method for high speed vacuum pumping of an enclosure on a intermittent basis. The method comprises the steps of connecting the enclosure through a vacuum valve to an expansion tank having a volume larger than the volume of the enclosure, vacuum pumping gas from the expansion tank and opening the vacuum valve for a predetermined time sufficient for substantial equalization of pressure in the enclosure and the expansion tank.

BRIEF DESCRIPTION OF THE DRAWINGS

For a better understanding of the present invention, together with other and further objects, advantages and capabilities thereof, reference may be had to the accompanying drawings which are incorporated herein by reference and in which:

FIG. 4 graphically illustrates the operation of the vacuum pumping apparatus of FIG. 3 as a function of time; and FIG. 5 is a schematic diagram of a multiple stage vacuum pumping apparatus for pumping of multiple enclosures.

DETAILED DESCRIPTION OF THE INVENTION

Figure 1:
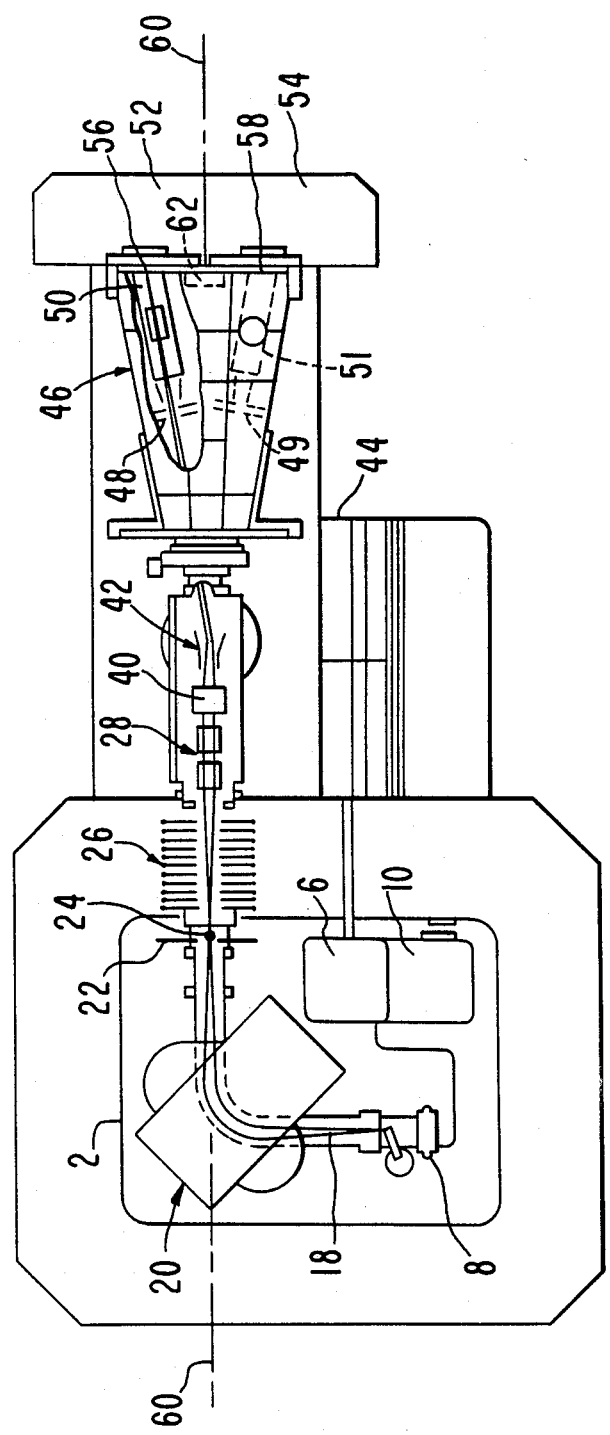
FIG. 1 is a schematic diagram of an ion implantation system.

The vacuum pumping apparatus and method according to the present invention is tyically used in an ion implantation system. An example of an ion implantation system is illustrated in FIG. 1. A high voltage terminal 2 is held at high potential relative to ground by a high voltage power supply (not shown). The terminal 2 houses the apparatus required to form a beam of ions of desired species. In common practice, a gaseous feed stock of the desired species is employed. A source gas produced from a gas handling system 6 is directed to an ion source 8 which is powered by a power supply 10 and provides a high current ion beam 18. Ion source techniques are generally known in the art. The ion beam 18 diverging from the ion source 8 is mass analyzed and focused by an analyzer magnet 20. The analyzed beam passes through a resolving aperture 22 and a variable slit 24 and then through an acceleration tube 26 where it encounters a carefully designed field gradient from the high voltage terminal 2 to ground potential. Optical elements such as a quadrupole lens 28 operate to produce a spatial energy focus at a target plane. Y deflection plates 40 and X deflection plates 42 provide electrostatic deflection which directs the beam 18 over the area of the target plane. The waveforms applied to the respective deflection plates to form the desired scanning pattern are provided by a scanning system 44.

A dual target chamber 46 includes a housing, beam defining masks 48, 49 and Faraday cages 50, 51 for beam monitoring. Automatic wafer handling systems 52, 54 introduce semiconductor wafers one at a time into the vacuum system in target positions 56, 58, respectively, align the same with respect to the target plane, provide cooling of the wafers during implantation and remove the wafers from the vacuum system after implantation is complete. Target positions 56, 58 are typically located within air locks, as described hereinafter, and are displaced horizontally on opposite sides of the longitudinal axis 60 of the undeflected beam 18 such as to require a beam deflection of about ±7° from the longitudinal axis for scanning thereof. A beam dump 62 is located on the longitudinal axis 60 in the target chamber 46 and intercepts the neutral portion of the ion beam 18.

Figure 2:
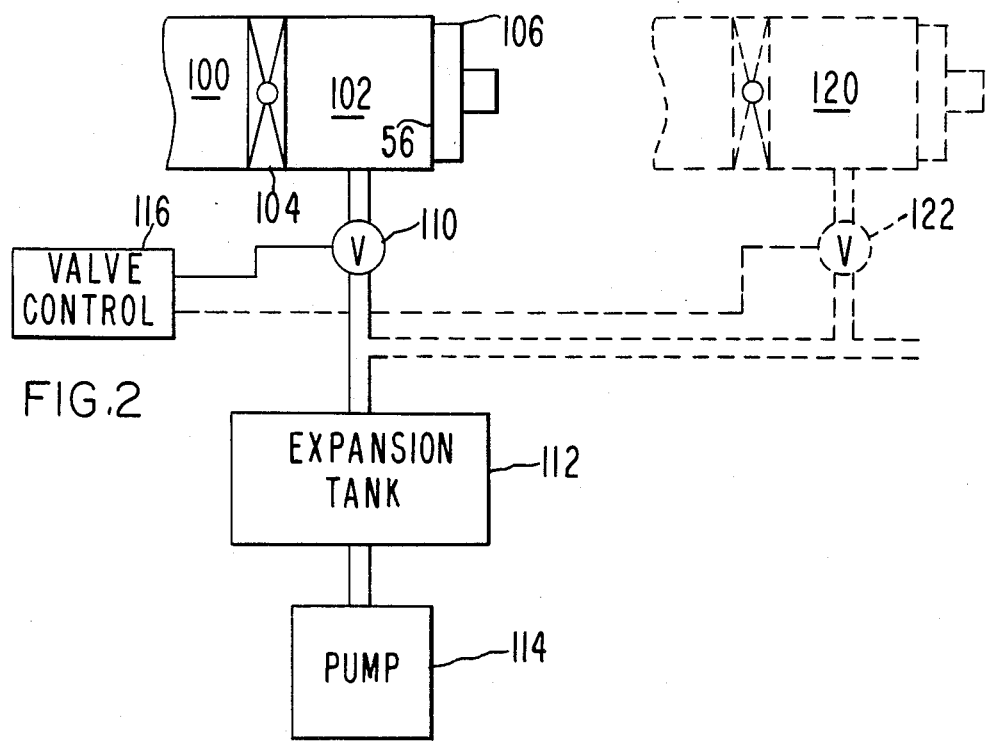
FIG. 2 is a schematic diagram of a single stage vacuum pumping apparatus in accordance with the present invention.

While vacuum pumping apparatus and the vacuum envelope are not shown in FIG. 1, it is to be understood that the entire region traversed by the ion beam is maintained at high vacuum and typically operates at about $10^{-6}$ torr. Operation in vacuum is necessary to insure that the ion beam strikes the wafer without colliding with gas molecules. Referring now to FIG. 2, the semiconductor wafer to be processed is introduced into a main processing chamber, or beamline 100, by means of an air lock 102. The air lock 102 permits introduction of a wafer into the vacuum chamber without significant loading of the vacuum in the beamline 100. When a wafer is to be introduced, a vacuum gate valve 104 seals the air lock 102 from the beamline 100. A chamber door 106 is then opened, a wafer is placed at the target position 56 and the chamber door 106 is closed. The air lock 102 is rapidly evacuated, as described hereinafter, the vacuum gate valve 104 is opened, and ion implantation of the wafer at target position 56 proceeds. When ion implantation is complete, the vacuum gate valve 104 is again closed, the chamber door 106 is opened and the wafer is removed. This procedure is repeated each time a wafer is processed. The volume of the air lock 102 is minimized in order to reduce the time required for evacuation thereof.

In a typical system, the wafer can be changed as frequently as every ten seconds and the evacuation of the air lock 102 must take place in about one second or less. Apparatus for high speed evacuation of the air lock 102 in accordance with the present invention is illustrated in schematic form in FIG. 2. The apparatus includes a vacuum valve 110 having one port coupled by a suitable conduit to the air lock 102. The other port of the vacuum valve 110 is coupled to an expansion tank 112. The expansion tank 112 has a volume larger than the volume of the air lock 102 and preferably has a volume at least ten times the volume of the air lock 102. A vacuum pump 114 is coupled to the expansion tank 112 and pumps gas therefrom continuously. A valve control means 116 is coupled to the control input of the vacuum valve 110 and controls its opening and closing.

In operation, the air lock 102 is sealed as described hereinabove. The vacuum valve 110 is opened by the valve control 116 and, very rapidly, the gas in the air lock 102 expands into the expansion tank 112. When the pressures in the expansion tank 112 and the air lock 102 have equalized, the vacuum valve 110 is closed, and the vacuum gate valve 104 can be opened. The pump 114 removes the gas from the expansion tank 112 continuously, including the time when the vacuum valve 110 is closed and a wafer is being processed. Assuming the average pressure in the expansion tank 112 is low in comparison with the initial atmospheric pressure in the air lock 102, the drop in pressure in the air lock 102 when the valve 110 is opened, is approximately proportional to the ratio of the volumes of the air lock 102 and the expansion tank 112. The expansion of gas from the air lock 102 into the expansion tank 112 occurs at or near the speed of sound. When the vacuum valve 110 is opened, the pressure in the expansion tank 112 rises abruptly and then decays exponentially due to the operation of the pump 114. In one example of the apparatus shown in FIG. 2, and described hereinabove, the air lock 102 had a volume of approximately 0.1 liter, the expansion tank 112 had a volume of 25 liters, and the pump 114 had a capacity of 3 liters per second. With this arrangement, the pressure in the air lock 102 dropped to the range of 5 to 10 torr upon opening of the vacuum valve 110.

It will be understood that, due to the rapid operation of the apparatus of FIG. 2, multiple air locks can be connected through individual vacuum valves to the expansion tank 112. A second air lock 120 and a second vacuum valve 122 are indicated by dotted lines in FIG. 2. Each of the air locks connected to the expansion tank 112 is vacuum pumped at different times in a time-sharing mode of operation.

Figure 3:
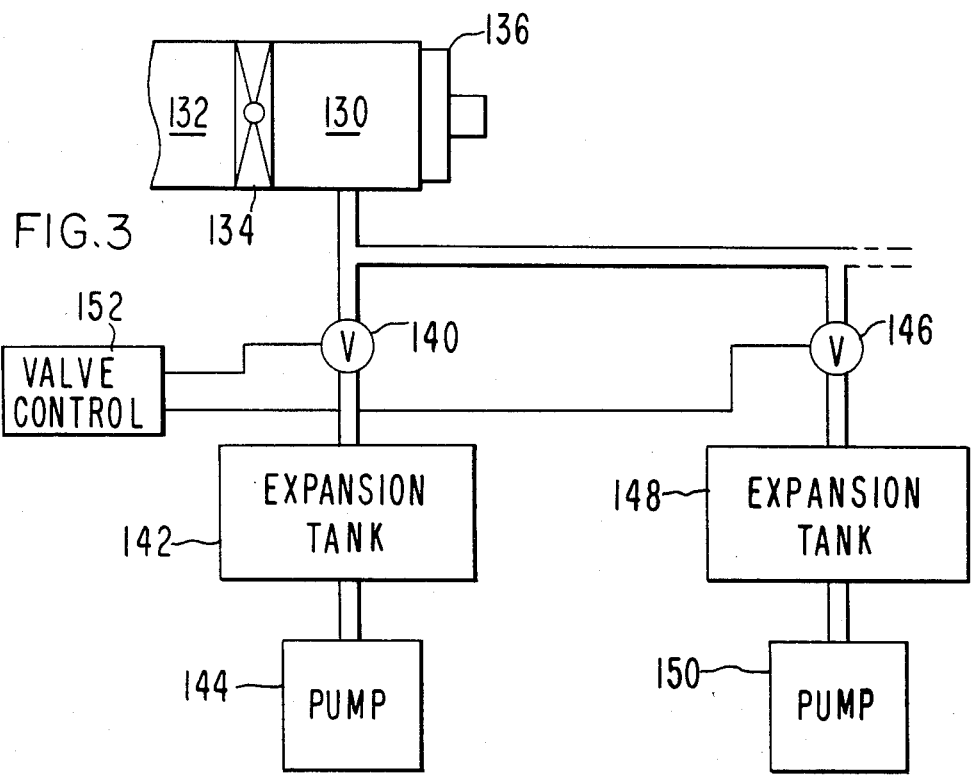
FIG. 3 is a schematic diagram of a two-stage vacuum pumping apparatus in accordance with the present invention.

A two-stage vacuum pumping apparatus, in accordance with the present invention, is shown in schematic form in FIG. 3. The operation of the apparatus of FIG. 3 is illustrated graphically in FIG. 4. An air lock 130 is isolated from a beamline 132 by a vacuum gate valve 134 and is accessed from atmosphere through a chamber door 136. The air lock 130 is coupled through a first vacuum valve 140 to a first expansion tank 142. A first vacuum pump 144 is coupled to the expansion tank 142. The air lock 130 is also coupled through a second vacuum valve 146 to a second expansion tank 148. A second vacuum pump 150 is coupled to the expansion tank 148. The opening and closing of the vacuum valves 140, 146 are controlled by a valve control means 152.

The operation of the apparatus of FIG. 3 will be explained with reference to FIG. 4 which illustrates the occurrence of various events as a function of time. The top two traces indicate the operation of the valves 140 and 146, respectively. The third and fourth traces indicate the pressures in the tanks 142 and 148, respectively, and the fifth trace indicates the pressure in the air lock 130. Vertically aligned points on the traces occur simultaneously. Initially, a wafer is introduced into the air lock 130 and the air lock 130 is sealed with atmospheric pressure therein. At time $t_1$, the vacuum valve 140 is opened for a brief period. The pressure in the tank 142 increases abruptly to $P_A$ and, at the same time, the pressure in the air lock 130 drops abruptly to $P_A$, as indicated in FIG. 4. The pressure in the expansion tank 142 now decays exponentially from $P_A$ back to a quiescent level due to the operation of the pump 144. At time $t_2$, the vacuum valve 146 is opened for a brief period; and the remaining gas in the air lock 130 rapidly expands into the expansion tank 148, causing a further drop in the pressure of the air lock 130 to $P_B$ and an increase in the pressure of the expansion tank 148 to $P_B$. The pressure in the expansion tank 148 decays exponentially from $P_B$ to a quiescent value due to the operation of the pump 150. The average pressure $\overline{P}_{148}$ of the expansion tank 148 is lower than the average pressure $\overline{P}_{142}$ of the expansion tank 142 because the quantity of gas introduced from the air lock 130 is lower in the case of the expansion tank 148. Thus, the second expansion tank 148 provides a further reduction in pressure in the air lock 130. At time $t_3$, the vacuum gate valve 134 is opened, and residual gas in the air lock 130 expands into the beamline 132 causing a further reduction in pressure in the air lock 130. Ion implantation now proceeds until the prescribed impurity ion dosage is reached. During ion implantation the expansion tanks 142, 148 are pumped. When ion implantation is complete, the vacuum gate valve 134 is closed; and at time $t_4$, the chamber door 136 is opened. A new wafer is introduced into the air lock 130, and the process is repeated.

It will be understood that additional vacuum pumping stages, each comprising a vacuum valve, an expansion tank, and a vacuum pump, can be connected to the air lock 130 in parallel with the two stages illustrated in FIG. 3 to further reduce the final pressure attained by the vacuum pumping system. The expansion tanks are connected to the air lock sequentially for a time sufficient to equalize the pressure in the expansion tank and the air lock. Thus, the quantity of gas remaining in the air lock 130 is further reduced by each additional stage. It will further be understood that the configurations of FIG. 2 and FIG. 3 can be combined to provide multiple stage pumping of multiple air locks thereby resulting in efficient usage of the pumping stages. Furthermore, it is preferable to utilize the same valve opening sequence when pumping each of the multiple air locks. This insures that the average pressure in successive expansion tanks is progressively lower. It will be obvious to those skilled in the art that the apparatus of the present invention can be used to evacuate any enclosure having a volume smaller than the volume of the expansion tank.

A preferred embodiment of the present invention providing multiple stage vacuum pumping of multiple air locks is illustrated in schematic form in FIG. 5. Air locks 160 and 162 are coupled through isolation vacuum valves 164 and 166, respectively, to an interconnection manifold 168. Expansion tanks 170 and 172 are coupled through stage vacuum valves 174 and 176, respectively, to the interconnection manifold 168. Vacuum pumps 178 and 180 are coupled to the expansion tanks 170 and 172, respectively. The opening and closing of the vacuum valves 164, 166, 174, 176 are controlled by a valve control means 182. The configuration shown in FIG. 5 is particularly appropriate for use with a dual end station ion implantation system, as illustrated in FIG. 1.

In operation, the vacuum valve 164 is opened, and the vacuum valve 166 is closed. The air lock 160 is then evacuated exactly as shown in FIGS. 3 and 4 and described hereinabove. At a later time, the vacuum valve 164 is closed, the vacuum valve 166 is opened, and the air lock 162 is evacuated, also, as shown and described hereinabove. It will be understood that multiple pumping stages and multiple air locks can be connected to the interconnection manifold 168. As noted hereinabove, this results in efficient usage of the pumping stages. Preferably, the same valve opening sequence is utilized when pumping each of the multiple air locks. The use of the interconnection manifold 168 provides the advantage that only one vacuum valve is required per air lock and one vacuum valve is required per expansion tank.

In an example of a vacuum pumping apparatus in accordance with FIG. 5, the air locks 160, 162 each had a volume of about 0.1 liter. The expansion tanks 170, 172 each had a volume of 25 liters, and the vacuum pumps 178, 180 each had a capacity of 3 liters per second. Each of the air locks 160, 162 was evacuated once every ten seconds on an alternating basis. The vacuum valves 174, 176 were opened sequentially, each for approximately 0.2 seconds. The total vacuum pumping time for each of the air locks 160, 162, including valve operating times, was approximately one second. The pressure in the air locks 160, 162, after operation of the first vacuum pumping stage, was approximately 5 to 10 torr; the pressure in the air locks 160, 162, after operation of the second vacuum pumping stage, was approximately 0.15 to 0.25 torr.

Thus, there is provided by the present invention methods and apparatus for high speed, intermittent vacuum pumping of an enclosure. The use of an expansion tank provides extremely high speed evacuation of the enclosure. In addition, as a result of the use of the expansion tank, the vacuum pump operates on a continuous basis and experiences relatively small excursions in pressure. Therefore, the stress on the pump during operation is small and its probable operating life is increased. Furthermore, since the pumping of the gas in the enclosure occurs slowly over an extended period, the vacuum pump can have relatively low capacity and low cost. The vacuum pumping apparatus in accordance with the present invention has been described as continuously pumping the expansion tanks. However, it will be understood that the requirement is for removal of the gas introduced into the expansion tanks from the air locks, either continuously or intermittently.

While there has been shown and described what is at present considered the preferred embodiments of the invention, it will be obvious to those skilled in the art that various changes and modifications may be made therein without departing from the scope of the invention as defined by the appended claims.

What is claimed is:

1. Apparatus for high speed, intermittent vacuum pumping of plural enclosures, said apparatus comprising:
    a plurality of vacuum pumping stages, each comprising
        a stage vacuum valve having one port coupled to an interconnection manifold,
        an expansion tank coupled to the other port of said stage vacuum valve, said tank having a volume larger than the volume of each of said enclosures and
        a vacuum pump coupled to said expansion tank and operative to pump gas from said expansion tank;
    a first isolation vacuum valve having one port coupled to said interconnection manifold and the other port coupled to a first one of said enclosures;
    a second isolation vacuum valve having one port coupled to said interconnection manifold and the other port coupled to a second one of said enclosures; and
    control means operative, when evacuation of a selected one of said enclosures is desired, to open the isolation valve associated with said selected enclosure and to open each of said stage vacuum valves sequentially for a predetermined time sufficient for substantial equalization of pressure in said selected enclosure and said expansion tank and to close each of said stage vacuum valves before the succeeding stage vacuum valve is opened, such that each selected enclosure is evacuated principally by rapid expansion of the gas therein into each of said expansion tanks rather than by direct operation of the vacuum pumps,
    whereby, high speed evacuation of plural enclosures is provided by time-shared operation of said vacuum pumping apparatus.

2. The vacuum pumping apparatus as defined in claim 1 wherein the volume of each expansion tank is at least ten times the volume of each enclosure.

3. The vacuum pumping apparatus as defined in claim 1 wherein each enclosure is an air lock utilized for transfer of semiconductor wafers into a vacuum processing chamber and wherein said air lock includes a door for the introduction of wafers and a vacuum gate valve for isolation of said air lock from said processing chamber.

4. The apparatus as defined in claim 1 wherein said enclosure is evacuated in one second or less.

* * * * *